(12) United States Patent
Cummings

(10) Patent No.: US 10,859,618 B2
(45) Date of Patent: Dec. 8, 2020

(54) RADIO ACCESS NETWORK TESTING ENCLOSURE

(71) Applicant: T-Mobile USA, Inc., Bellevue, WA (US)

(72) Inventor: Oscar Ramses Cummings, Seattle, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 179 days.

(21) Appl. No.: 16/236,967

(22) Filed: Dec. 31, 2018

(65) Prior Publication Data

US 2019/0331718 A1 Oct. 31, 2019

Related U.S. Application Data

(60) Provisional application No. 62/662,665, filed on Apr. 25, 2018.

(51) Int. Cl.
| | |
|---|---|
| *G01R 29/08* | (2006.01) |
| *H04W 36/00* | (2009.01) |
| *G01R 29/10* | (2006.01) |
| *H04B 17/382* | (2015.01) |
| *G01R 31/28* | (2006.01) |

(52) U.S. Cl.
CPC ..... *G01R 29/0821* (2013.01); *G01R 29/0878* (2013.01); *G01R 29/10* (2013.01); *G01R 31/2822* (2013.01); *H04B 17/382* (2015.01); *H04W 36/0085* (2018.08)

(58) Field of Classification Search
CPC G01R 29/0821; G01R 29/0878; G01R 29/10; G01R 31/2822; G01R 1/18; H04W 36/0085; H04B 17/382
USPC ........................................................ 455/67.14
See application file for complete search history.

(56) References Cited

U.S. PATENT DOCUMENTS

| | | | |
|---|---|---|---|
| 2008/0125053 A1* | 5/2008 | Stojcevic | G01R 29/105 455/67.14 |
| 2014/0187173 A1* | 7/2014 | Partee | H04L 43/045 455/67.12 |
| 2015/0109941 A1* | 4/2015 | Zhang | H04W 88/02 370/252 |

* cited by examiner

*Primary Examiner* — Ayodeji O Ayotunde
(74) *Attorney, Agent, or Firm* — Lee & Hayes, P.C.

(57) ABSTRACT

A testing enclosure can be used while testing telecommunications devices. In some examples, the testing enclosure includes at least one radio frequency (RF) shielded box configured to couple with a wireless telecommunications device and protect the telecommunications device from ambient RF signals while the telecommunications device is under test. The testing enclosure may include a panel, a switch, and an attenuator. In some examples, the testing enclosure may receive a radio signal from a radio source located outside of the testing enclosure and provide the radio signal to the telecommunications device under testing via the panel, the switch and/or the attenuator.

20 Claims, 7 Drawing Sheets

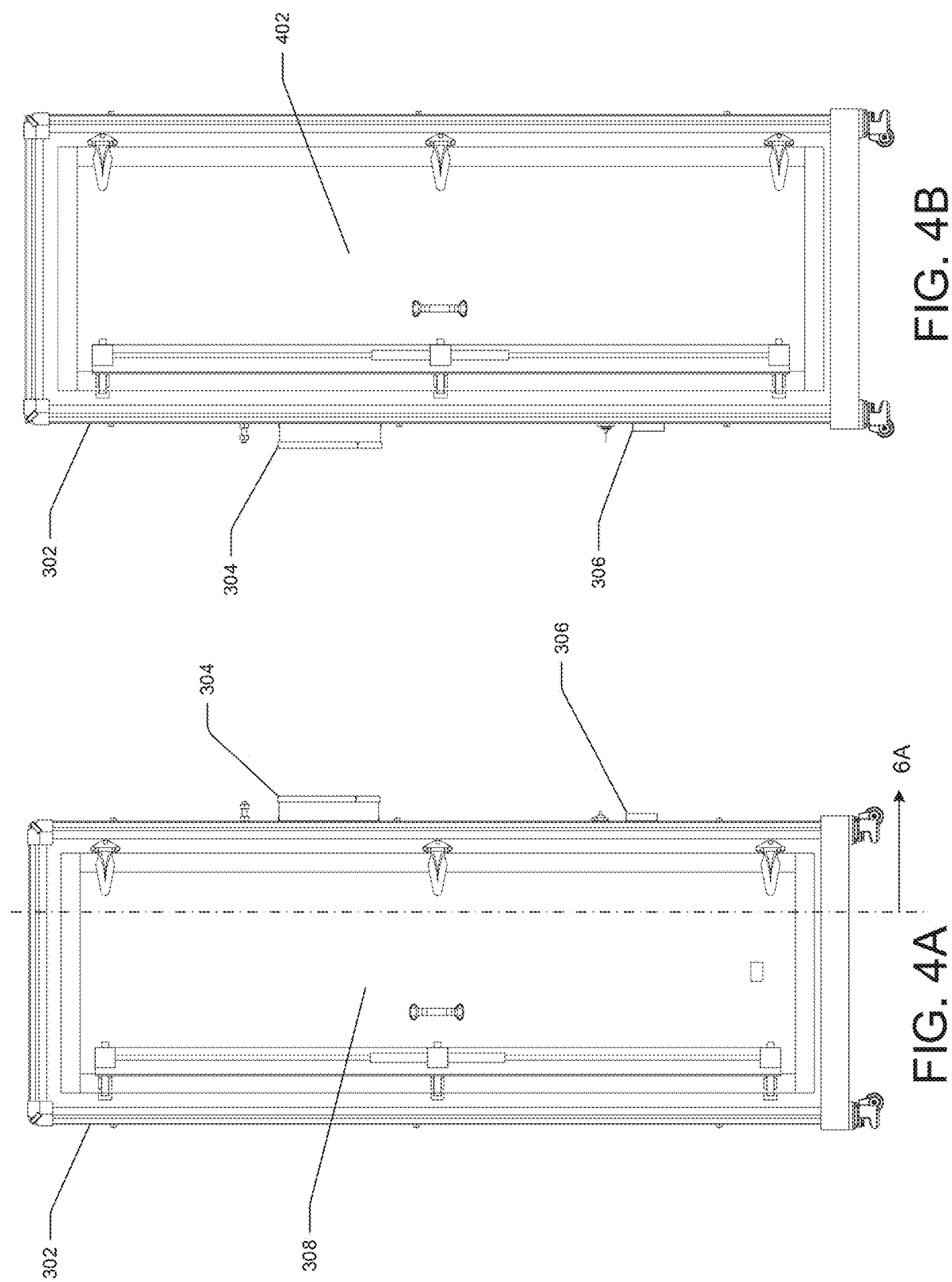

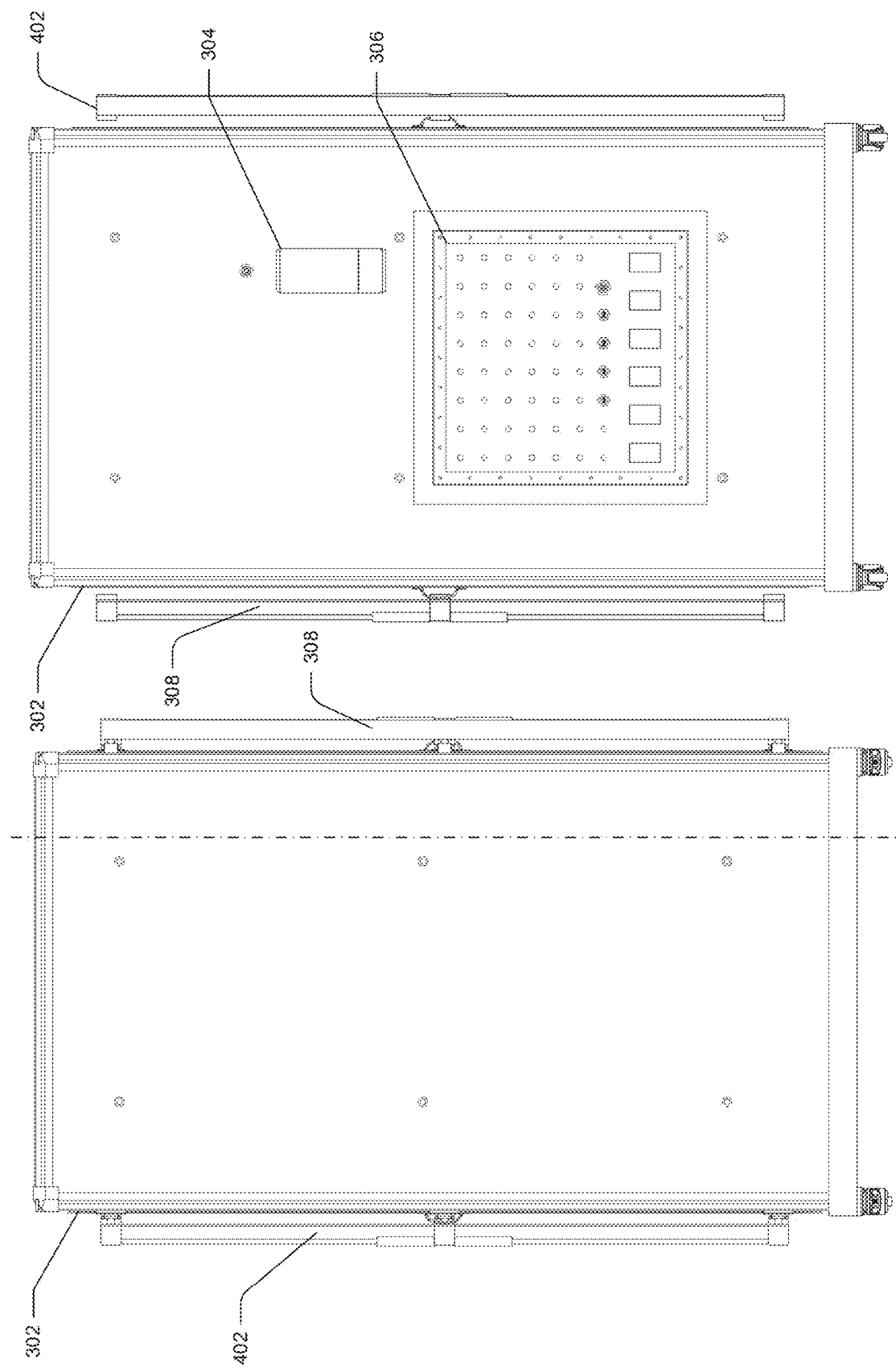

RADIO ACCESS NETWORK TESTING ENCLOSURE

CROSS REFERENCE TO RELATED APPLICATIONS

This patent application claims priority filing benefit from U.S. Provisional Patent Application No. 62/662,665, filed Apr. 25, 2018, which is hereby incorporated by reference, in its entirety.

FIELD OF THE DISCLOSURE

The present disclosure relates generally to testing telecommunications devices and, more particularly, this disclosure relates to a testing system capable of using various testing protocols for testing multiple telecommunications devices within a radio frequency (RF) shielded enclosure to shield the telecommunications devices from ambient RF signals.

BACKGROUND

A release of a new product can be a complicated endeavor when the new product includes new technology. Not only do traditional concerns exist about marketing, inventory, and sales of the new product, but other concerns exist that may relate to compatibility, operation, and future costs, among other concerns related to deployment of the new product that includes new technology.

Before a product (e.g., device, system, software, and/or hardware) is implemented in the market and/or made available for consumption, the product often undergoes rigorous testing to ensure that the product is fully functional/operational upon deployment. This testing can be time consuming and expensive, especially when the new product must be tested at multiple types of testing stations that are dispersed in a testing facility. Traditional testing platforms may not address the issue of ambient radio frequency (RF) energy interfering with a telecommunication device under testing conditions.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items or features.

FIG. 4A illustrates the third example embodiment of a testing enclosure from a front view, in accordance with various implementations of the disclosure.

FIG. 4B illustrates the third example embodiment of a testing enclosure from a back view, in accordance with various implementations of the disclosure.

FIG. 5A illustrates the third example embodiment of a testing enclosure from a side view, in accordance with various implementations of the disclosure.

FIG. 5B illustrates the third example embodiment of a testing enclosure from a side view, in accordance with various implementations of the disclosure.

DETAILED DESCRIPTION

Figure 1:
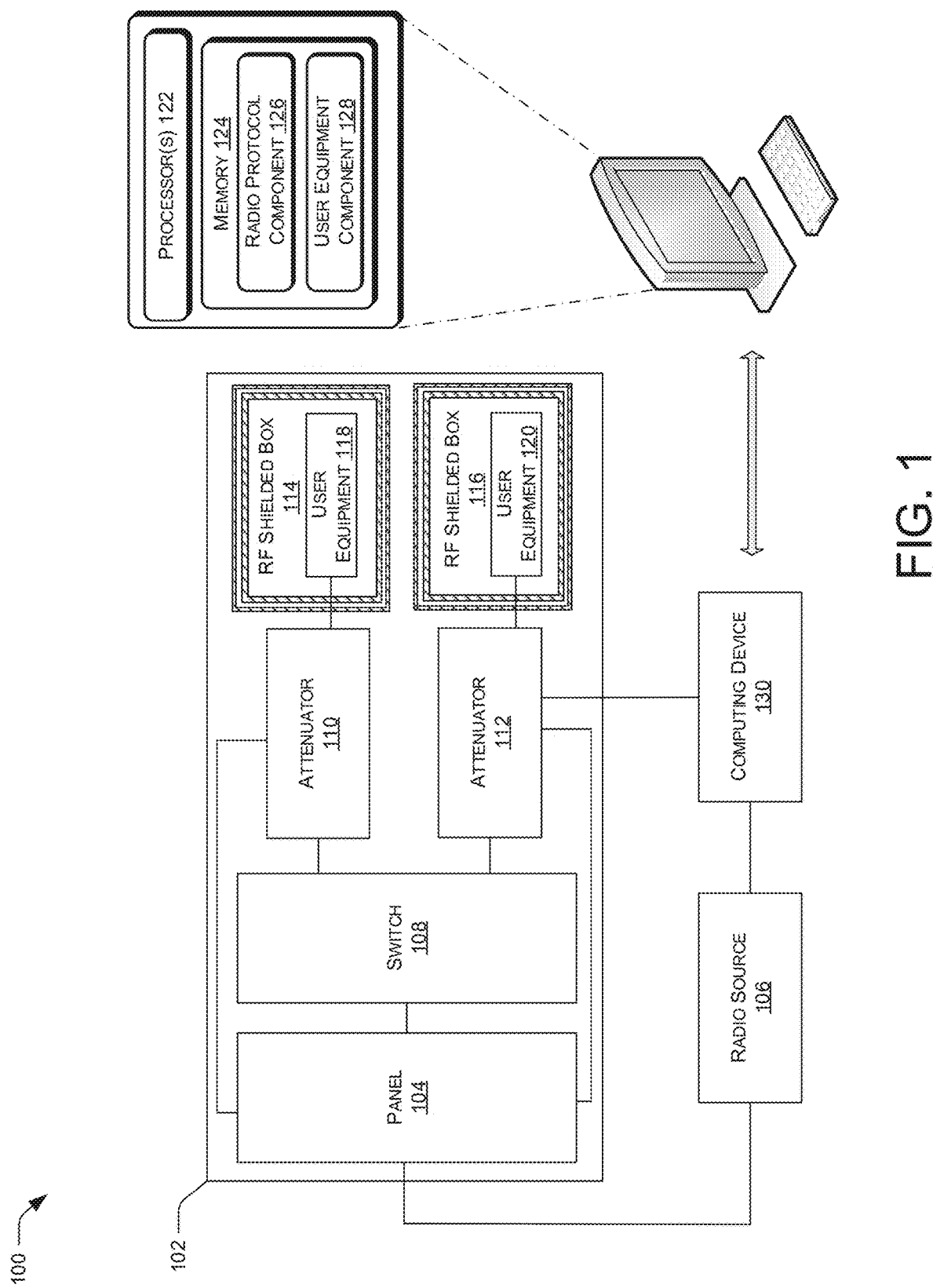
FIG. 1 illustrates a block diagram overview of an exemplary testing system which includes a testing enclosure, in accordance with various implementations of the disclosure.

A testing enclosure system may be used to perform repeatable testing of a device, such as a wireless telecommunications device (herein referred to as user equipment (UE)) as the UE operates on a communications network provided by a radio located outside of the testing enclosure. The UE can operate using a variety of radio access technologies (e.g., 2G, 3G, 4G, 5G, Citizen Broadband Radio Service (CBRS) Wi-Fi, Bluetooth, NFC, etc.) and therefore a large amount of equipment is needed to test all the functionality of the various radio access technologies. A testing engineer may want to test various aspects of the UE as it operates on different radio signal wavelengths, different radio access technologies, different combinations of radio signals, and/or different radio signal strengths. Manipulating the radio signal that the UE receives as it is being tested requires different types and amounts of equipment (e.g., switches, attenuators, panels, connectors, special cables, antennas, etc.). Furthermore, an engineer may want to test multiple UEs within a confined space in order to maximize the testing efficiency of the space.

It is therefore desirable to test the UEs in isolated environments that may be shielded from allowing RF energy to leave the environment within the enclosure and from RF energy entering the environment, while at the same time providing easy access to a radio signal, a switch, and an attenuator in order to change, combine, reduce, or otherwise affect the radio signal that the UE receives. The testing protocols may be performed within an RF shielded box which shields the UE from ambient RF energy that is unassociated with (e.g. not generated because of) the testing protocols and which may potentially interfere with or otherwise affect the results of the testing protocols. The ambient RF energy may include ambient RF signals, such as RF signals generated proximate to the testing environment but unassociated with the testing protocol.

By way of example, and without limitation, the testing enclosure system (also referred to as a testing system or a testing apparatus) may include one or more panels, switches, attenuators, RF shielded boxes, a radio source, a computing device, and multiple ports to provide access to the components housed by the testing enclosure. During a testing protocol, a radio source located outside of the testing enclosure may provide a radio signal (e.g., via a wired connection) to a port on a panel located on an exterior side of the testing enclosure. The panel may be coupled with a switch and/or an attenuator located in an interior of the testing enclosure, thereby providing the radio signal to the switch and/or the attenuator. A UE may be located within an RF shielded box that is also located in the interior of the testing enclosure and coupled with the attenuator. There may be multiple ports located on the exterior and in the interior of the RF shielded box such that the RF shielded box may receive the radio signal from the attenuator and provide the signal to the UE.

Additionally, the attenuator may be coupled with a computing device that may enable a tester to perform operations on the UE in the testing protocol. The operations in the testing protocol may include, without limitation, initiating voice calls, transmitting and receiving data (messages, videos, music, etc.), executing applications, browsing the Internet, executing performance test, performing handover events and performing other operations. By initiating operations using the automated testing enclosure such as those described above with respect to the testing protocol, the UE may be tested in a laboratory environment (e.g., with minimal interference from reflected radio signals and/or from external devices) using an automated process and include quick cycle times, improving efficiency and repeatability. Results of the testing protocols may be captured and analyzed to determine performance of the UE and/or the radio, which may be compared to threshold performance metrics or used for other purposes.

The systems, devices, and techniques described herein can be implemented in a number of ways. Example implementations are provided below with reference to the following figures. It should be appreciated that the subject matter of the disclosure can be reasonably modified, rearranged, or otherwise altered, in accordance with embodiments of the disclosure.

FIG. 1 illustrates an overview of an illustrative testing environment 100 that includes a testing enclosure 102 having a panel 104. The testing enclosure 102 may be constructed out of any material suitable to support the components of the testing enclosure 102, such as, but not limited to, aluminum and/or steel. In some examples, the dimensions of the testing enclosure 102 may be 3 ft.×4 ft.×7 ft. The panel 104 may include an exterior portion usable to couple with a radio source 106 and an interior portion usable to couple with a switch 108. The switch 108 may couple with an attenuator 110 and an attenuator 112. In some cases, the panel 104 may also couple with the attenuators 110 and 112. The attenuator 110 may couple with an RF shielded box 114 and the attenuator 112 may couple with an RF shielded box 116. The RF shielded box 114 may include multiple connectors usable to couple with a UE 118 such that the UE 118 may receive a radio signal from the radio source 106 via the panel 104, the switch 108, and the attenuator 110. Similarly, the RF shielded box 116 may include multiple connectors usable to couple with a UE 120 such that the UE 120 may receive the radio signal from the radio source 106 via the panel 104, the switch 108, and the attenuator 112.

In some instances, the panel 104 may be removable from the testing enclosure 102 and may be located on a side wall of the testing enclosure 102. The panel 104 may include any number of ports and/or connectors and may include any type of port and/or connector that may provide a radio signal or any other type of signal, data, transmission, and/or energy into the testing enclosure 102. In some cases, the panel 104 may include one or more SMA (male or female) type connectors, one or more ethernet ports, one or more USB ports, and/or one or more QMA type connectors. For example, the panel 104 may include as many as fifty N-type connectors, four USB connectors, a fiber-optic feed through, and six 10/100/1000BASE-T connectors.

In some examples, the radio source 106 may include a base transceiver station (BTS) (or corresponding eNodeB, gNodeB, access point, and the like) and may provide any type of signal that the UEs 118 and 120 may operate on. For example, the radio signal may include, for example, radio frequency outputs such as Long-Term Evolution (LTE), 3G, 4G, 5G, Citizen Broadband Radio Service (CBRS), Wi-Fi, and so forth. The radio source 106 may provide any type of radio signal to the UEs 118 and 120 that may enable the UEs 118 and 120 to perform an action (e.g., initiating voice/video calls, receiving voice/video calls, transmitting and receiving data (messages, videos, music, etc.), executing applications, browsing the Internet, etc.). The radio source 106 may include multiple ports usable to connect to one of the multiple ports and/or connectors located on the panel 104. In some cases, the system 100 may include multiple testing enclosures 102(N), where N is any integer greater than or equal to 1, such that the radio source 106 may provide a radio signal to multiple testing enclosures 102(N).

In some examples, the switch 108 may be usable to receive the radio signal from the panel 104 (which may include as many inputs as there are radios to be connected) and to pass the signal thru the attenuators 110 and 112. In some cases, the switch 108 may be bypassed and the panel 104 may be directly connected to the attenuators 110 and 112.

In some examples, the testing enclosure 102 may include the attenuator 110 and the attenuator 112. Although two attenuators are illustrated in FIG. 1, any number of attenuators may be included in the testing enclosure 102. The attenuators 110 and 112 may be communicatively coupled with the computing device 130 via a wired or wireless connection such that a tester may attenuate the radio signal that the UEs 118 and 120 receive from the radio source 106. In accordance with one or more embodiments, the radio signal from the radio source 106 may be modified by the attenuators 110 and 112 to enable simulation of signals deployed in a field environment (i.e., replicate live network scenarios) while in a lab or testing environment. For example, a user may desire to test an operation of the UEs 118 and 120 when subjected to signals that simulate a dense urban environment where signals reflect off of buildings and other man-made or natural features of the field environment. In these embodiments, the radio signals from the radio source 106 may be processed by the attenuators 110 and 112 via the computing device 130 to simulate a decrease in signal strength, as part of a mobility scenario.

In some instances, the testing enclosure 102 may include the RF shielded boxes 114 and 116. Although two RF shielded boxes are illustrated in FIG. 1, any number of RF shielded boxes may be included in the testing enclosure 102. The RF shielded boxes 114 and 116 may be communicatively coupled with the attenuators 110 and 112 such that each of the RF shielded boxes 114 and 116 may receive the radio signal. For example, the RF shielded boxes 114 and 116 may include multiple ports on an exterior of each of the RF shielded boxes 114 and 116 and include multiple ports on an interior of the RF shielded boxes 114 and 116. The RF shielded boxes 114 and 116 may receive an RF signal from the attenuators 110 and 112 via the exterior ports and provide the RF signal to the UEs 118 and 120 via the interior ports. The RF shielded boxes 114 and 116 may be configured to provide suitable isolation for the UEs 118 and 120 such that, while the UEs 118 and 120 are under test, the RF shielded boxes 114 and 116 shield and/or absorb any RF energy from external sources.

In some instances, the UEs 118 and 120 may include mobile telephones (including smartphones), netbooks, tablet computers, personal computers, data sticks, network adapters, IoT devices, wearable devices, smart home devices, and other electronic devices that can exchange signals with the radio source 106.

The testing enclosure system may also include the computing device 130 that may be connected to the radio source 106 the attenuators 110 and/or 112, and/or the UEs 118 and 120. In some cases, the computing device may attenuate a radio signal provided to the UEs 118 and 120 and may cause the UEs 118 and 120 to perform actions and to store results of those actions. For instance, the computing device 130 may cause the UEs 118 and 120 to perform various actions (e.g., initiating voice calls, transmitting and receiving data (messages, videos, music, etc.), executing applications, browsing the Internet, etc.) while the UEs 118 and 120 are receiving the radio signal from the radio source 106. While the actions are being performed, the tester may manipulate the radio signal by adjusting a combination of the radio signals using the computing device 130 and/or attenuating the signal using computing device 130. In some cases, the computing device 130 may cause one of or both of the UEs 118 and 120 to initiate a handover event. The computing device 130 may store the results of the actions as the radio signal is being manipulated. The computing device 130 may be equipped with one or more processor(s) 122 and memory 124.

The memory 124 may include applications, components, and/or data. In some embodiments, the memory 124 may include a radio protocol component 126 and a UE component 128 to perform test scenarios on the radio source 106 and the UEs 118 and 120.

The radio protocol component 126 may generate and transmit instructions that cause the radio source 106 to broadcast a network such that the UEs 118 and 120 may operate on the network. For example, the radio protocol component 126 may be coupled to the radio source 106 to enable the radio source 106 to function as an RF base station for testing one or more of the functionalities or features of the UEs 118 and 120 under test. The radio protocol component 126 may cause the radio source 106 to function as a radio outputting radio frequencies such as LTE, 3G, 4G, 5G, CBRS, Wi-Fi, and so forth. In some embodiments, the radio protocol component 126 may generate and transmit instructions to cause the radio source 106 to receive signal data representing a RF signal transmitted from the UEs 118 and 120. The radio protocol component 126 may then store the signal data in the memory 124 of the computing device 130. In some examples, the signal data may indicate a signal strength at which the UEs 118 and 120 are receiving the broadcasted network.

In some instances, the radio protocol component 126 may be configured to control one or more of a 3' Generation (3G) base station, a $4^{th}$ Generation (4G) base station, a 5' Generation (5G) base station, a dual-connectivity base station or base station system (e.g., configured to communicate in accordance two or more 3G, 4G, or 5G protocols).

The UE component 128 may generate and transmit instructions that cause the UEs 118 and 120 to perform operations while enclosed by the RF shielded boxes 114 and 116. For example, the UE component 128 may cause the UEs 118 and 120 to turn on, access a network broadcast by the radio source 106, and perform operations such as, but not limited to, initiating voice/video calls, receiving voice/video calls, transmitting and receiving data (messages, videos, music, etc.), executing applications, browsing the Internet, and performing other operations. In some examples, the UE component 128 may be configured to receive measurement data indicating a performance metric of an operation performed by the UEs 118 and 120. In some examples, the UE component 128 may cause the UEs 118 and 120 to transmit an RF signal to be received by the radio source 106. The RF signal may include a signal strength at which the UEs 118 and 120 are receiving the broadcasted network. In some instances, the UE component 128 can be configured to receive measurement data associated with the RF signal received by the UEs 118 and 120, such as frequency, signal strength, signal-to-interference-plus-noise ratio (SINR), GPS signal for location services that could trigger communication protocols established in the standards, such as 3GPP.

In some embodiments, the computing device 130 may include a display screen for displaying information associated with the testing. In accordance with various embodiments, the computing device 130 may include a monitor, which may display a user interface (UI) to enable the user to interact with the various components of the memory 124.

The computing device 130 may be positioned either in the interior or in the exterior of the testing enclosure 102. In some embodiments, the computing device 130 can be positioned within the testing enclosure 102 and can be communicatively coupled to the UEs 118 and 120. Any one of the communication channels illustrated in FIG. 1 may include an optical fiber in order to limit the electrical signal current transmitted within the testing enclosure 102. In particular, transmitting information as pulses of light does not emit RF radiation and may be less susceptible to RF interference. In some embodiments, the communication channels may include a conductive wire type connection, e.g. a wire configured to transmit data via electric pulses such as a USB cable, or a wireless communication link between an RF antenna within the testing enclosure 102.

Figure 2:
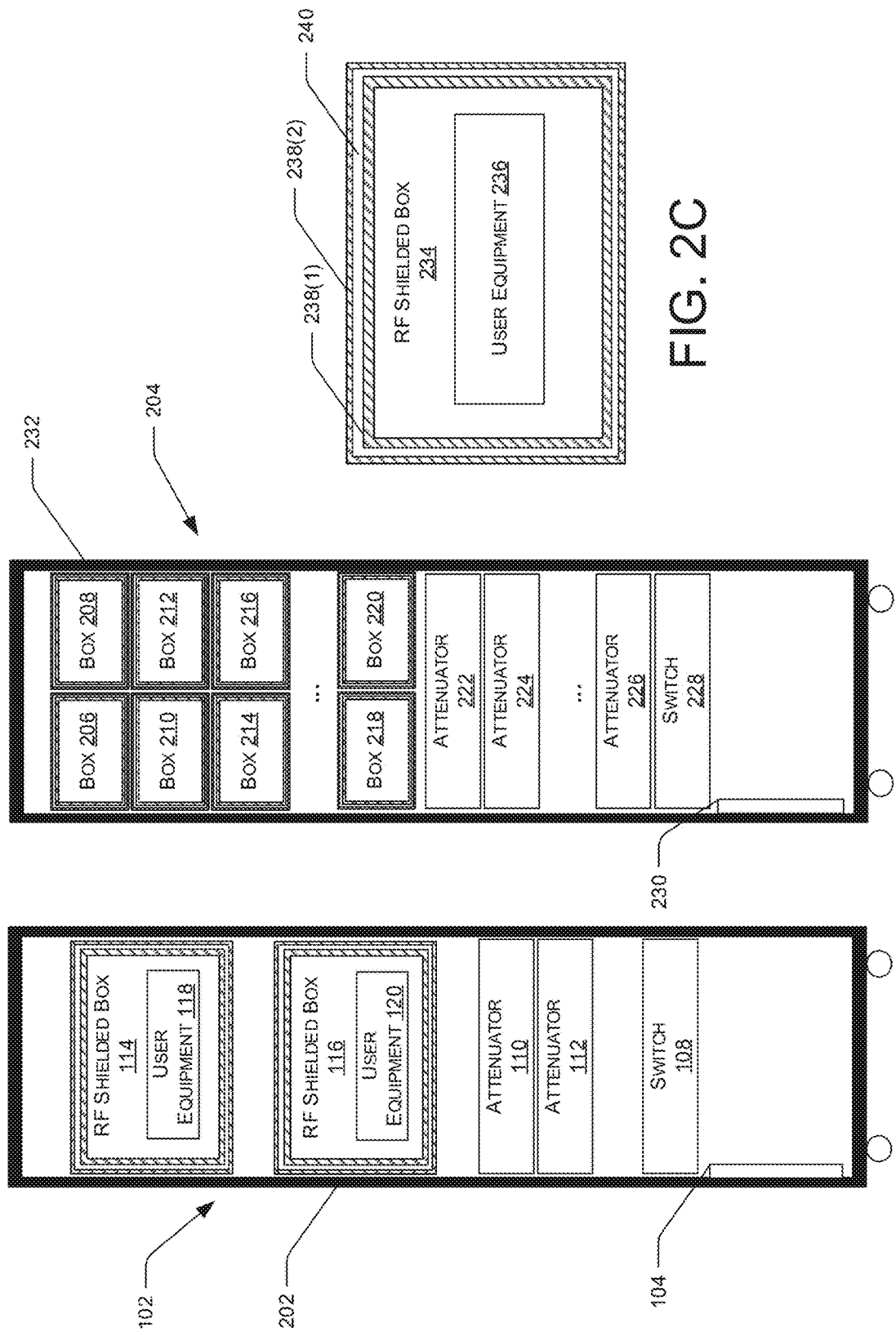
FIG. 2A illustrates a first example embodiment of a testing enclosure, in accordance with various implementations of the disclosure.
FIG. 2B illustrates a second example embodiment of a testing enclosure, in accordance with various implementations of the disclosure.
FIG. 2C illustrates an example radio frequency (RF) shielded box, in accordance with various implementations of this disclosure.

FIG. 2A illustrates an example embodiment of the testing enclosure 102 that includes the panel 104, the switch 108, the attenuators 110 and 112, the RF shielded boxes 114 and 116, and the UEs 118 and 120. As illustrated in FIG. 2A, the components of the testing enclosure 102 may be housed in a cabinet 202 and stacked to form a vertical column. In some cases, the cabinet 202 may include a rack for supporting each component of the testing enclosure 102. Although FIG. 2A illustrates a single UE (i.e., the UE 118) in the RF shielded box 114 and a single UE (i.e., UE 120) in the RF shielded box 116, each of the RF shielded boxes 114 and 116 may enclose multiple UEs that may be coupled to one of the multiple ports located within the RF shielded boxes 114 and 116 such that multiple UEs may be under test at the same time within each of the RF shielded boxes 114 and 116.

FIG. 2B illustrates an example embodiment of a testing enclosure 204 that includes RF shielded boxes 206, 208, 210, 212, 214, 216, 218, and 220, attenuators 222, 224, 226, and 228, and a panel 230. As illustrated in FIG. 2B, the components of the testing enclosure 204 may be housed in a cabinet 232 and stacked to form a vertical column. In some cases, the cabinet 232 may include a rack to support each component of the testing enclosure 204. Although FIG. 2B illustrates eight RF shielded boxes (i.e., RF shielded boxes 206, 208, 210, 212, 214, 216, 218, and 220), there may be any number of RF shielded boxes housed within the cabinet 232 of the testing enclosure 204. Similarly, although three attenuators (i.e., attenuators 222, 224, and 226) are illustrated in FIG. 2B, there may be any number of attenuators housed within the cabinet 232 of the testing enclosure 204.

Each of the RF shielded boxes 206, 208, 210, 212, 214, 216, 218, and 220 may enclose a UE or multiple UEs (such as the UEs 118 and 120) and may be configured to couple with the UE via ports located within each of the RF shielded boxes 206, 208, 210, 212, 214, 216, 218, and 220. In some examples, the RF shielding of the RF shielded box 206 can prevent radio signals generated with the box 206 from entering the RF shielded box 208. Each of the RF shielded boxes 206, 208, 210, 212, 214, 216, 218, and 220 may be usable to perform a different type of test on the respective UE enclosed inside. For example, the RF shielded box 206 may perform a handover test on a UE enclosed within the RF shielded box 206 while the RF shielded box 208 may perform a geolocation test on a UE enclosed within the RF shielded box 208. In some cases, more than one of the RF shielded boxes 206, 208, 210, 212, 214, 216, 218, and 220 may perform the same type of test. In some examples, the tests that may be performed include, but are not limited to initiating a handover event for a mobility test scenario, inter/intra handover scenarios, a geolocation-based test, E911 location test, basic regression, negative test cases, RF performance, voice quality, or features testing.

FIG. 2C illustrates an RF shielded box 234 including a UE 236. In some embodiments, the RF shielded box 234, as well as the RF shielded boxes 114, 116, 206, 208, 210, 212, 214, 216, 218, and 220, may include two or more conductive layers 238 for providing suitable isolation at relevant frequencies. Conductive layers 238 may be made from any material suitable for shielding the relevant frequencies of RF energy such as, for example, aluminum, copper, or steel. Furthermore, the conductive layers 238 may designed to provide substantial shielding effectiveness such as, e.g. higher than 60 dB or higher than 80 dB. In some embodiments, the conductive layers 238 may be flexible in nature (as opposed to rigid) such as a cloth material embedded with stainless steel or a wire mesh material as the RF carrier material used to absorb and/or shield RF energy. In some embodiments, the conductive layers 238 may be a solid metallic sheet material, e.g. an aluminum sheet metal. In some embodiments, the conductive layers 238 may be separated by an insulator 240 such as, for example, a RF absorber, such as a non-conductive foam, which may reduce a multipath effect or attenuate a signal inside the RF shielded boxes or an air gap. Conductive layers 238 (also referred to as conductive materials 238) may function as a Faraday cage to block external signals from entering the interior region RF shielded box 234 and to prevent interference during testing of the UE 236. In some embodiments, the conductive layers 238 may be connected to a ground path to enable dissipation or drain of any absorbed energy to ground.

Figure 3:
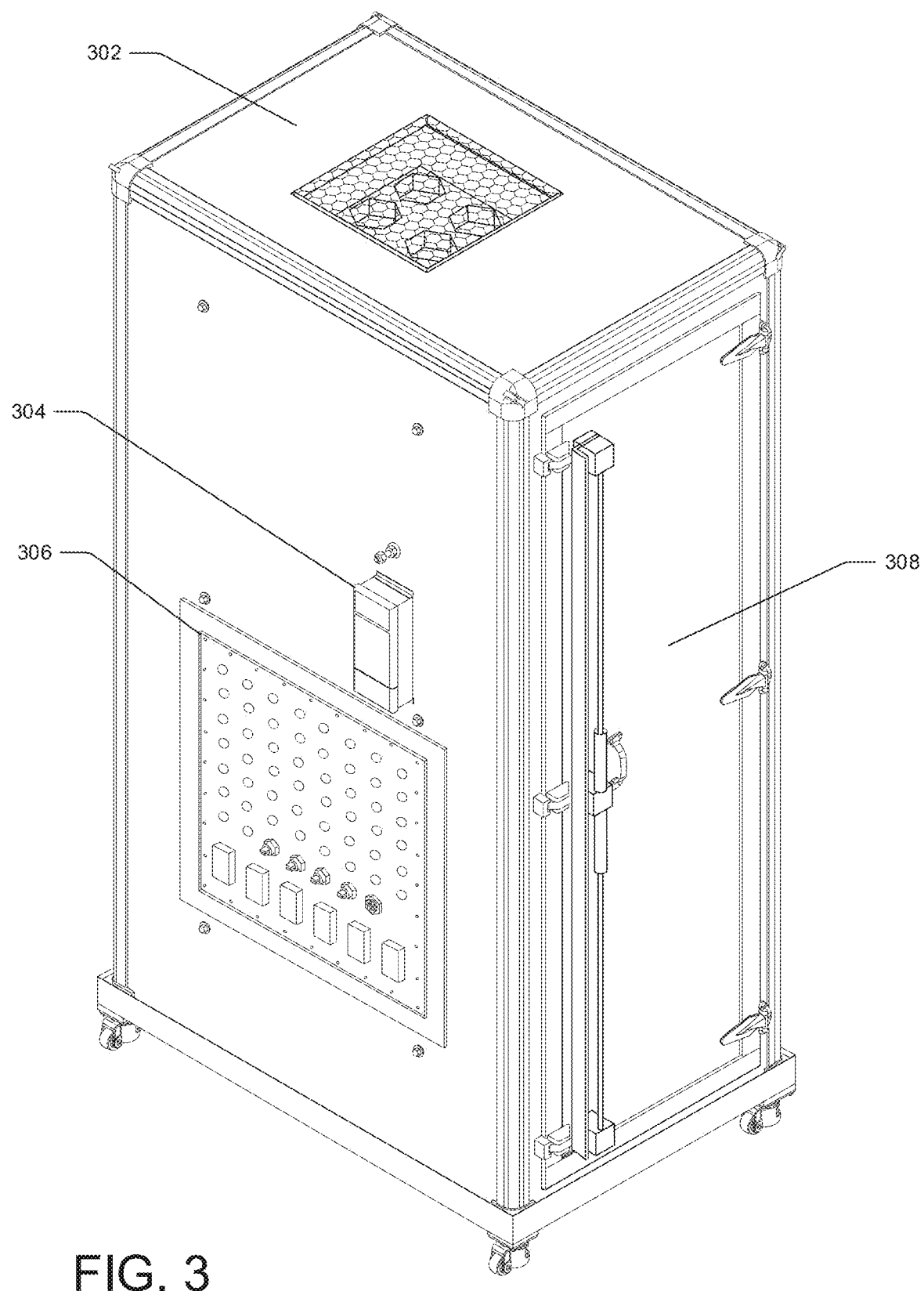
FIG. 3 illustrates a third example embodiment of a testing enclosure from a perspective view, in accordance with various implementations of the disclosure.

FIG. 3 illustrates an example testing enclosure 302, similar to the testing enclosures 102 and 204, that includes a filter 304, a panel 306, and a front door 308. In some examples, the filter 304 may enable a tester to connect different elements and filaments from an exterior of the testing enclosure 302 to the components within an interior of the testing enclosure 302 while filtering out any unwanted frequencies from the interior of the testing enclosure 302. For example, the filter 304 may receive electro-magnetic (EM) energy from a power source outside of the testing enclosure 302 that includes both power transmission frequencies (e.g. 120-volt power alternating at 60 Hz) and communications frequencies (e.g. power-line communication (PLC) signal data or absorbed RF-energy). In terms of lowering potential interference and increasing repeatability of testing conditions, the filter 304 may readily transmit the power transmission frequencies into the testing enclosure 302, for example, to the switch 108, the attenuators 110 and 112, the RF shielded boxes 114 and 116, and/or the UEs 118 and 120. In some embodiments, the filter 304 filters high-frequency energy out of the EM-energy while transmitting low-frequency energy into the testing enclosure 302 to power internal componentry. High-frequency energy may be defined as energy above a predetermined frequency threshold while low-frequency energy may be defined as energy below the predetermined threshold. For example, any EM energy above/below 100 Hz (or 60 Hz for that matter) may be defined as high-frequency/low-frequency energy, respectively. The filter 304 may include an interior panel which may contain one or more SMA or N (male or female) type connectors, one or more ethernet ports, one or more USB ports, and/or one or more QMA type connectors. In some instances, the filter 304 may include one or more signal line filters configured to reduce electro-magnetic interference and/or radio frequency interference associated with an Ethernet input or LAN input to the testing enclosure 302.

In some examples, the panel 306, similar to the panel 104, may be removable from the testing enclosure 302 and may be located on a side wall of the testing enclosure 302. The panel 306 may include any number of ports and/or connectors and may include any type of port and/or connector that may provide a radio signal or any other type of signal, data, transmission, and/or energy into the testing enclosure 302. In some cases, the panel 306 may include one or more SMA (male or female) type connectors, one or more ethernet ports, one or more USB ports, and/or one or more QMA type connectors. For example, the panel 306 may include as many as fifty N-type connectors, four USB connectors, a fiber-optic feed through, and six 10/100/1000BASE-T connectors.

FIG. 4A illustrates the example testing enclosure 302 including the filter 304, the panel 306, and the front door 308 shown from a front point of view.

FIG. 4B illustrates the example testing enclosure 302 including the filter 304, the panel 306, and a back door 402 shown from a back point of view.

FIG. 5A illustrates the example testing enclosure 302 including the front door 308 and the back door 402 shown from a side point of view.

FIG. 5B illustrates the example testing enclosure 302 including the filter 304, the panel 306, the front door 308 and the back door 402 shown from a side point of view.

Figure 6B:
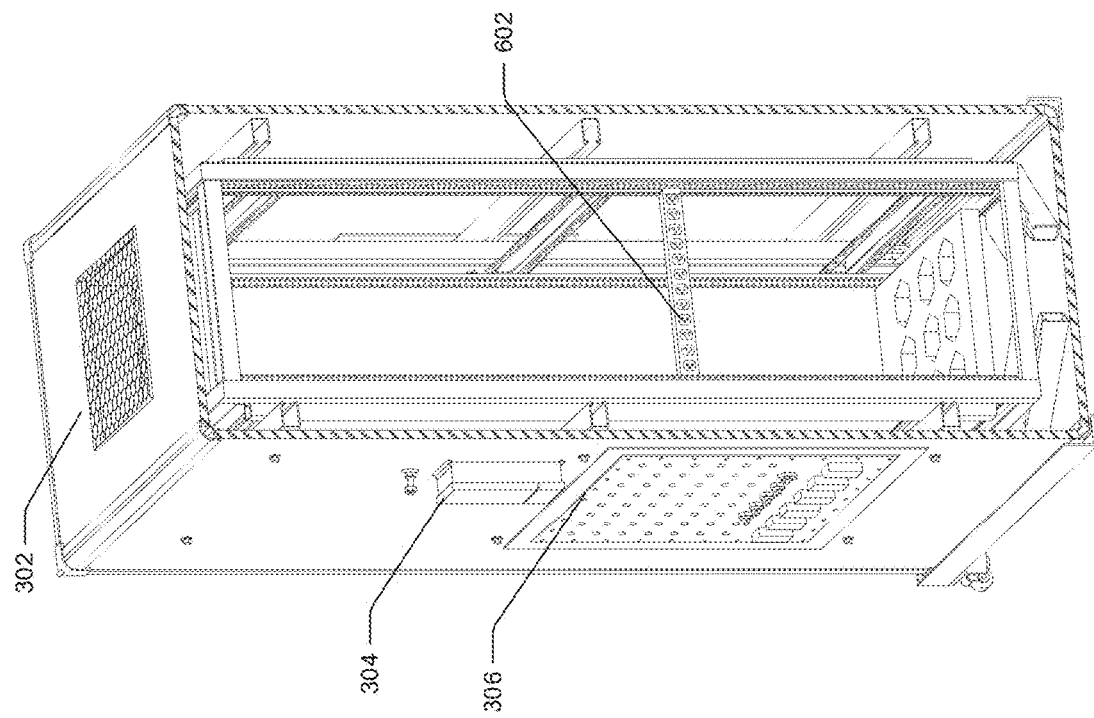
FIG. 6B illustrates a partial cutaway side view, taken on the line 6B of FIG. 5A, in accordance with various implementations of the disclosure.
Figure 6A:
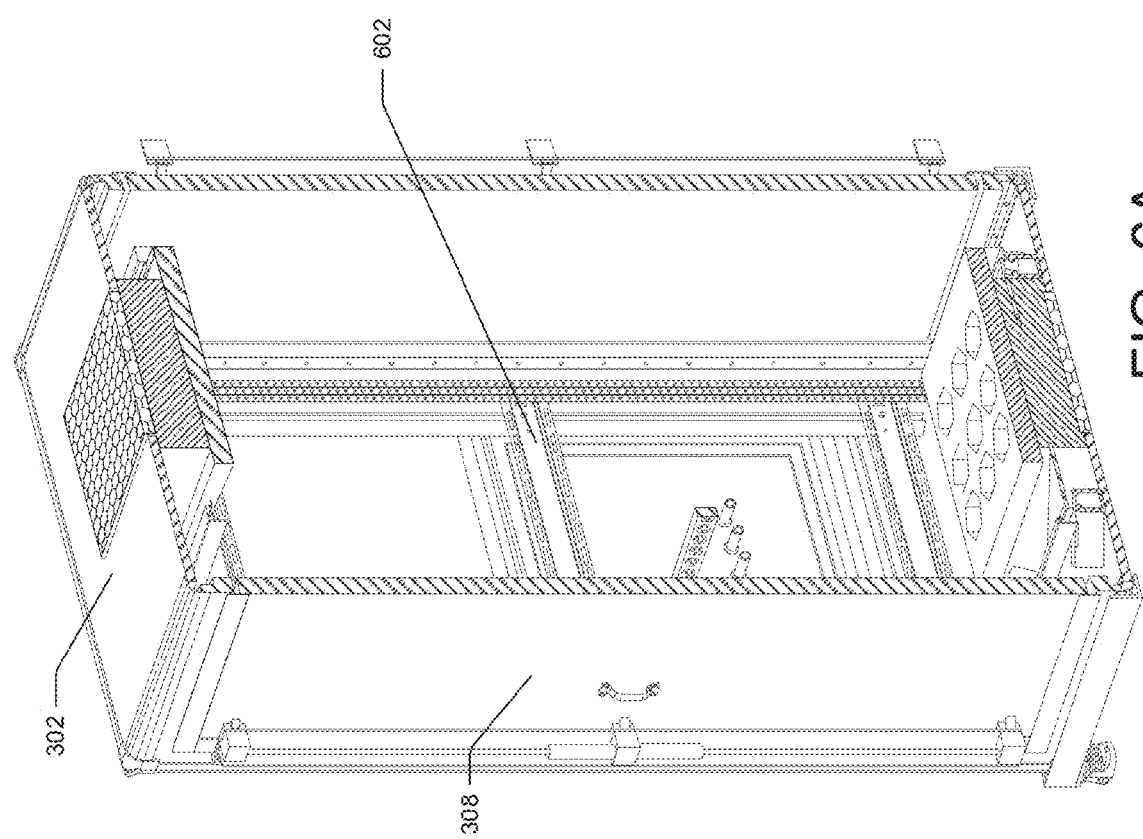
FIG. 6A illustrates a partial cutaway side view, taken on the line 6A of FIG. 4A, in accordance with various implementations of the disclosure.

FIG. 6A shows a partial cutaway side view of an example testing enclosure 302 including the front door 308 and a rack 602. The rack 602 may be used to support any of the components stored in the testing enclosure 302, such as the switch 108, the attenuators 110 and/or 112, and/or the RF shielded boxes 114 and/or 116.

FIG. 6B shows a partial cutaway side view of an example testing enclosure 302 including the filter 304, the panel 306 and the rack 602. Although the components discussed herein are not shown in FIG. 6A or 6B, it is to be understood that any combination of components may be housed within the example testing enclosure 302 shown in FIGS. 6A and 6B.

Figure 7:
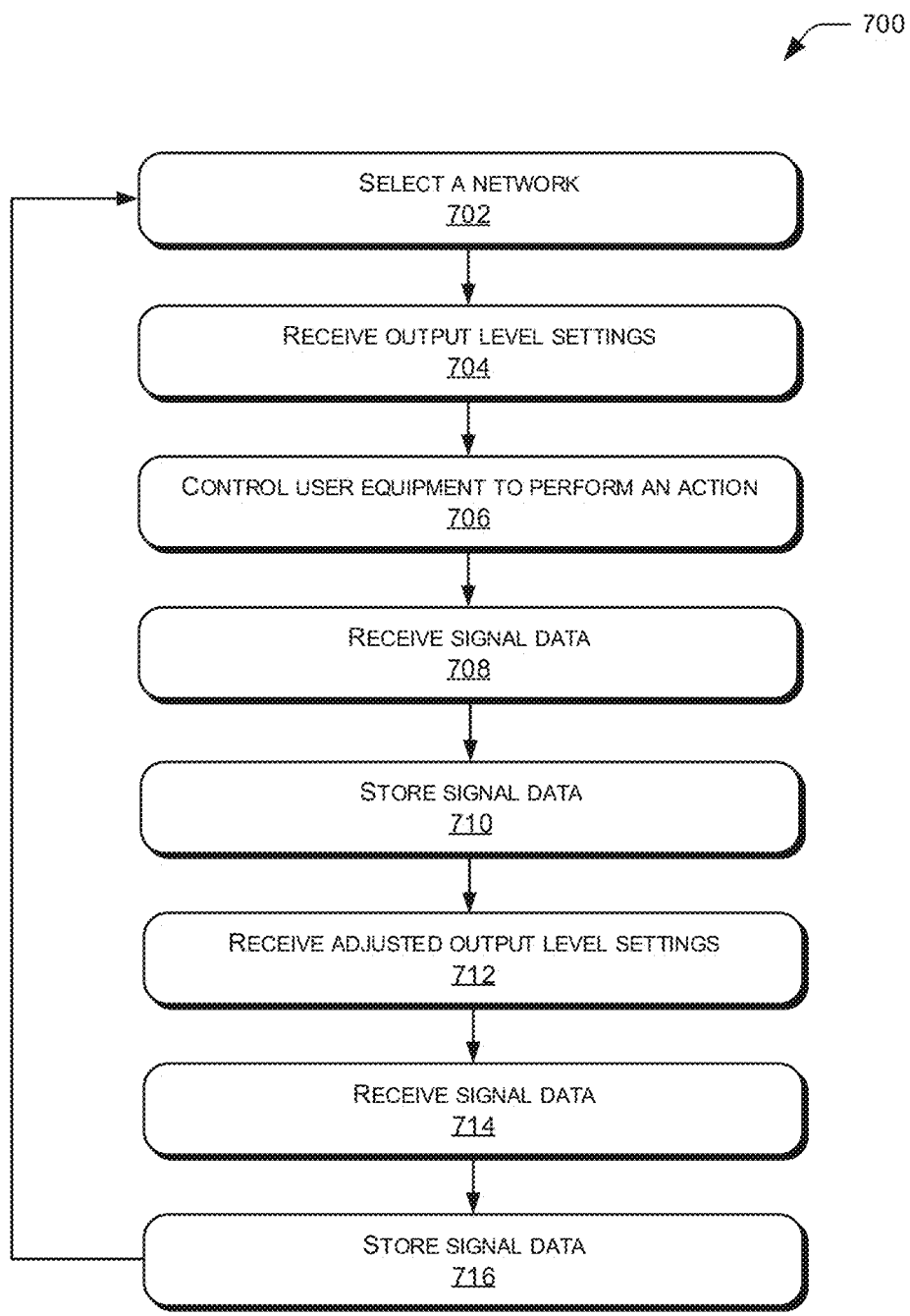
FIG. 7 is a flow diagram of an illustrative process of a computing device capturing radio signal data from a user equipment (UE) while the UE is undergoing testing, in accordance with embodiments of the disclosure.

FIG. 7 illustrates an example process in accordance with embodiments of the disclosure. This process is illustrated as a logical flow graph, each operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the process.

FIG. 7 is a flow diagram of an illustrative process 700 of a computing device capturing signal data from a UE while the UE is securely enclosed within a radio frequency shielded enclosure, in accordance with embodiments of the disclosure. The example process 700 can be performed by the computing device 130 in conjunction with the radio source 106 and/or the UEs 118 and 120, in connection with other components discussed herein. Some or all of the process 700 can be performed by one or more devices, equipment, or components illustrated in FIGS. 1-6, for example.

At operation 702, the computing device may select a network. In some embodiments, the radio protocol component 126 of the computing device 130 may select one or more network configurations of the radio source 106. For example, the radio protocol component 126 may cause the radio source 106 to emit a radio signal, such as, but not limited to LTE, 3G, 4G, 5G, CBRS, Wi-Fi, and so forth.

At operation 704, the computing device may receive output level settings. For example, a tester may adjust the combination of the radio signals emitted by the radio source 106 (and/or additional radio sources) to the UEs 118 and/or 120 via the switch 108, the attenuator 110, and/or the attenuator 112 and the computing device 130 may receive the details of the combination via user input. In some embodiments, the computing device 130 may be connected to the attenuator 110 and/or the attenuator 112 and may receive the details of the attenuation from the attenuators 110 and 112.

At operation 706, the computing device may control the UE to perform an action. For example, the UE component of the computing device 130 may cause the UEs 118 and/or 120 to turn on, access a network broadcast by the radio source 106, and perform operations such as, but not limited to, initiating voice/video calls, receiving voice/video calls, transmitting and receiving data (messages, videos, music, etc.), running applications, browsing the Internet, and performing other operations. In some examples, the UE component 128 may cause the UEs 118 and/or 120 to transmit an RF signal to be received by the radio source 106. The RF signal may include a signal strength at which the UEs 118 and/or 120 receives the broadcasted network. In some examples, the operation 706 can further include controlling the radio source 106 to communicate with the UEs 118 and/or 120 using a particular frequency, polarization, and/or communication technology (e.g., 3G, 4G, or 5G).

At operation 708 the computing device may receive signal data. For example, the radio protocol component 126 of the computing device 130 may generate and transmit instructions to cause the radio source 106 to receive signal data representing a RF signal transmitted from the UEs 118 and/or 120. In some examples, the signal data may indicate a signal strength at which the UEs 118 and/or 120 receive the broadcasted network. In some examples, the operation 708 may include the computing device 130 receiving signal data representing a RF signal captured by the UEs 118 and/or 120 and broadcast by the radio source 106. In some examples, the received signal data may include a result of an action performed by the UEs 118 and/or 120. For example, the signal data may indicate a speed at which an operation (e.g., initiating voice calls, transmitting and receiving data (messages, videos, music, etc.), running applications, browsing the Internet, and performing other operations) was performed.

At operation 710 the computing device may store the signal data. For example, the radio protocol component 126 and/or the UE component 128 may store the signal data in the memory 124 of the computing device 130.

At operation 712, the computing device may receive adjusted output level settings. For example, the computing device 130 may receive user input indicating that an adjustment has been made via the radio source 106 and/or the attenuators 110 and/or 112. In some examples the computing device 130 may receive the adjustment information via a wired or wireless connection to the radio source 106 and/or the attenuators 110 and/or 112. In some examples, the adjustment information can be input manually into the computing device 130.

At operation 714, the computing device may receive signal data. For example, the radio protocol component 126 of the computing device 130 may generate and transmit instructions to cause the radio source 106 to receive signal data representing a RF signal transmitted from the UEs 118 and/or 120. In some examples, the signal data may indicate a signal strength at which the UEs 118 and/or 120 receive the adjusted network. In some examples, the operation 714 may include the computing device 130 receiving signal data representing a RF signal captured by the UEs 118 and/or 120 and broadcast by the radio source 106. In some examples, the received signal data may include a result of an action performed by the UEs 118 and/or 120 while the UEs 118 and/or 120 are experiencing the adjusted output levels. For example, the signal data may indicate a speed at which an operation (e.g., initiating voice calls, transmitting and receiving data (messages, videos, music, etc.), running applications, browsing the Internet, and performing other operations) was performed at the adjusted output levels.

At operation 716 the computing device may store the signal data. For example, the radio protocol component 126 and/or the UE component 128 may store the signal data that is associated with the adjusted output levels in the memory 124 of the computing device 130.

In some instances, the process 700 can be performed iteratively to substantially exhaustively test combinations of frequencies, actions, combinations, attenuations, and the like available to test for a particular radio source and/or UE. Accordingly, the systems, devices, and techniques discussed herein can efficiently and safely test a variety of devices in a repeatable manner.

Although the subject matter has been described in language specific to structural features and/or methodological acts, it is to be understood that the subject matter defined in the appended claims is not necessarily limited to the specific structural features or acts described. Rather, the specific structural features and acts are disclosed as exemplary forms of implementing the claims. The scope of the present disclosure and appended claims is not limited by these exemplary forms. In particular, numerous variations, whether explicitly provided for by the specification or implied by the specification, such as variations in structure features and/or methodological acts, whether now known in the art or subsequently developed, may be implemented by one of skill in the art in view of this disclosure.

What is claimed is:

1. A testing system comprising:
 a testing enclosure including:
  a first box having a first set of ports, the first box being configured to reflect ambient radio frequency (RF) energy produced outside of the first box;
  a first attenuator having a second set of ports and being communicatively coupled to the first box;
  a second box having a third set of ports, the second box being configured to reflect ambient radio frequency (RF) energy produced outside of the second box;
  a second attenuator having a fourth set of ports and being communicatively coupled with the second box;
  a switch being communicatively coupled with the first attenuator and the second attenuator; and
  a panel configured to receive a radio signal and to provide the radio signal to the switch; and
 a radio source communicatively coupled to the panel to provide the radio signal.

2. The testing system of claim 1, wherein the first box, the first attenuator, the second box, the second attenuator, and the switch are vertically aligned within the testing enclosure.

3. The testing system of claim 1, wherein at least one of the first box or the second box is configured to couple with a user equipment (UE) for testing such that the at least one of the first box or the second box provides the radio signal to the UE.

4. The testing system of claim 3, wherein the first box and the second box are comprised of a material configured to reflect ambient RF signals such that ambient RF signals do not interfere with testing of the UE.

5. The testing system of claim 3, further comprising a computing device configured to provide instructions to at least one of the first attenuator or the second attenuator, the instructions including causing the UE to perform an action.

6. The testing system of claim 5, wherein the radio signal is a first radio signal, and wherein the action includes initiating a handover event from the first radio signal to a second radio signal.

7. The testing system of claim 5, wherein the action includes initiating a geolocation test.

8. The testing system of claim 1, further comprising a rack wherein the first box, the first attenuator, the second box, the second attenuator, and the switch are coupled with the rack.

9. The testing system of claim 1 further comprising a power filter coupled with the testing enclosure, the power filter including at least one of:
 a fiber port;
 a SMA connector;
 an AC/DC power filter;
 an ethernet connector; or
 a USB port.

10. The testing system of claim 1, wherein the radio source includes at least one of a Long Term Evolution (LTE) radio source, a Third Generation (3G) radio source, a Fourth Generation (4G) radio source, a Fifth Generation (5G) radio source, a Citizen Broadband Radio Service (CBRS) radio source, or a Wi-Fi radio source.

11. The testing system of claim 1, wherein the panel is configured to be removable from the testing enclosure and the panel includes at least one of:
 an N-type bullhead connector;
 a USB connector;
 a fiber optic connector;
 a 10BASE-T interface;
 a 100BASE-T interface; or
 a 1000BASE-T interface.

12. A testing apparatus comprising:
 multiple boxes comprised of a material configured to reflect ambient RF signals, a first box of the multiple boxes being configured to house a first user equipment (UE) for testing and a second box of the multiple boxes being configured to house a second UE;
 one or more first attenuators coupled with the first box;
 one or more second attenuators coupled with the second box; and
 at least one input panel communicatively coupled with the one or more first attenuators and the one or more second attenuators and configured to receive a radio signal;
 wherein the first box is configured to perform a first type of test and the second box is configured to perform a second type of test that is different than the first type of test.

13. The testing apparatus of claim 12, further comprising a rack wherein the multiple boxes, the one or more first attenuators, and the one or more second attenuators are coupled to the rack and are vertically aligned within the rack.

14. The testing apparatus of claim 12, wherein the at least one input panel is configured to provide the radio signal to the one or more first attenuators and the one or more second attenuators, the one or more first attenuators and the one or more second attenuators are configured to provide the radio signal to the multiple boxes, the first box is configured to provide the radio signal to the first UE, and the second box is configured to provide the radio signal to the second UE.

15. The testing apparatus of claim 12, wherein the input panel comprises a removable connector panel located on an exterior of the testing apparatus and the testing apparatus further comprises a power filter located proximate to the removable connector panel.

16. The testing apparatus of claim 12, wherein the first type of test and the second type of test are configured to run at the same time.

17. The testing apparatus of claim 12, wherein at least one of the first type of test or the second type of test include at least one of:
 initiating a handover event for a mobility test scenario;
 inter/intra handover scenarios;
 a geolocation-based test;
 E911 location test;
 basic regression;
 negative test cases;
 RF performance;
 voice quality; or
 features testing.

18. A testing apparatus comprising:
 at least one box that is within an interior of an enclosure, the at least one box being at a first height and being configured to reflect ambient RF signals produced outside of the box;
 at least one attenuator that is within the interior of the enclosure, the at least one attenuator being at a second height that is below the first height; and
 at least one door configured to allow access to the interior of the enclosure.

19. The testing apparatus of claim 18, further comprising:
 a switch being communicatively coupled with the at least one attenuator; and
 a panel configured to receive a radio signal and to provide the radio signal to the switch.

20. The testing apparatus of claim 19, wherein the at least one box is configured to couple with a UE for testing such that the at least one box provides the radio signal to the UE.

* * * * *